(12) United States Patent
Sato

(10) Patent No.: US 11,079,439 B2
(45) Date of Patent: Aug. 3, 2021

(54) PROTECTION CIRCUIT FOR BATTERY MONITORING DEVICE, AND BATTERY MONITORING DEVICE

(71) Applicants: AutoNetworks Technologies, Ltd., Mie (JP); Sumitomo Wiring Systems, Ltd., Mie (JP); Sumitomo Electric Industries, Ltd., Osaka (JP)

(72) Inventor: Shinichiro Sato, Mie (JP)

(73) Assignees: AutoNetworks Technologies, Ltd., Yokkaichi (JP); Sumitomo Wiring Systems, Ltd., Yokkaichi (JP); Sumitomo Electric Industries, Ltd., Osaka (JP)

( * ) Notice: Subject to any disclaimer, the term of this patent is extended or adjusted under 35 U.S.C. 154(b) by 245 days.

(21) Appl. No.: 16/467,344

(22) PCT Filed: Nov. 16, 2017

(86) PCT No.: PCT/JP2017/041172
§ 371 (c)(1),
(2) Date: Jun. 6, 2019

(87) PCT Pub. No.: WO2018/105342
PCT Pub. Date: Jun. 14, 2018

(65) Prior Publication Data
US 2019/0324091 A1 Oct. 24, 2019

(30) Foreign Application Priority Data
Dec. 7, 2016 (JP) .............................. JP2016-237263

(51) Int. Cl.
G01R 31/382 (2019.01)
H02H 9/04 (2006.01)
(Continued)

(52) U.S. Cl.
CPC .......... G01R 31/382 (2019.01); H01M 10/48 (2013.01); H02H 9/045 (2013.01); H02J 7/0029 (2013.01)

(58) Field of Classification Search
None
See application file for complete search history.

(56) References Cited

U.S. PATENT DOCUMENTS

2011/0175573 A1 7/2011 Ueki

FOREIGN PATENT DOCUMENTS

JP S59-122733 U 8/1984
JP 3150369 U 5/2009
(Continued)

OTHER PUBLICATIONS

International Search Report, Application No. PCT/JP2017/041172, dated Jan. 30, 2018. ISA/Japan Patent Office.

*Primary Examiner* — Roy Y Yi
(74) *Attorney, Agent, or Firm* — Honigman LLP

(57) ABSTRACT

In a protection circuit, a signal line group includes a plurality of voltage signal lines, and the voltage signal lines are connected to electrode portions of a plurality of unit batteries or electrode portions of a battery module. A first protection circuit portion includes a plurality of Zener diodes, and the Zener diodes are connected in parallel to the unit batteries between the plurality of voltage signal lines. A resistor portion group includes a plurality of resistor portions, and the resistor portions are interposed between the Zener diodes and the unit batteries on the voltage signal lines and restrict a current. A second protection circuit portion includes a plurality of varistors, and the varistors are connected in parallel to the unit batteries between the plurality of voltage signal lines.

2 Claims, 5 Drawing Sheets

(51) Int. Cl.
*H02J 7/00* (2006.01)
*H01M 10/48* (2006.01)

(56) References Cited

FOREIGN PATENT DOCUMENTS

| | | | |
|---|---|---|---|
| JP | 2013-121246 | A | 6/2013 |
| JP | 2014-090635 | A | 5/2014 |

PROTECTION CIRCUIT FOR BATTERY MONITORING DEVICE, AND BATTERY MONITORING DEVICE

CROSS-REFERENCE TO RELATED APPLICATIONS

This application is the U.S. national stage of PCT/JP2017/041172 filed on Nov. 16, 2017, which claims priority of Japanese Patent Application No. JP 2016-237263 filed on Dec. 7, 2016, the contents of which are incorporated herein.

TECHNICAL FIELD

The present disclosure relates to a protection circuit for a battery monitoring device, and a battery monitoring device.

BACKGROUND ART

In the case where a battery module, in which a plurality of battery cells (unit batteries) are connected to each other in series, is used as an in-vehicle battery, it is desireable that the voltage and the like of each of the battery cells is monitored to monitor the state of the battery cells. In this regard, Patent Document 1 discloses an example of a battery system in which the voltage of each battery cell is monitored by a voltage measurement unit via a voltage measurement line. With this battery system, if a voltage greater than usual is applied to the battery module, a current flows through a Zener diode via a fuse that is provided in the voltage measurement line, and the fuse blows out. This blowout of the fuse protects the circuit.

However, in the battery system disclosed in Patent Document 1, if the fuse blows out once, then the voltage of the battery cells cannot be monitored in a corresponding path unless an operation to replace the blown fuse with a new fuse is performed. That is to say, in this battery system, the voltage cannot be monitored in the path in which the fuse has blown out after the operation to protect the circuit through the blowout of the fuse has been performed. To recover the voltage monitoring, a laborious operation cannot be avoided.

The present disclosure has been made based on the foregoing situation, and aims to provide a protection circuit for a battery monitoring device that can protect a circuit from an overcurrent without blowing out a path, as well as to provide a battery monitoring device.

Solution to Problem

A first disclosure is a protection circuit for a battery monitoring device that monitors a battery module having a configuration in which a plurality of unit batteries are connected to each other in series. The protection circuit includes a signal line group including a plurality of voltage signal lines, which are electrically connected to inter-battery electrode portions between the plurality of unit batteries that are connected to each other in series, or electrode portions at end portions of the battery module. A first protection circuit portion includes a plurality of Zener diodes that are connected to each other in series, the Zener diodes being connected in parallel to the unit batteries between the plurality of voltage signal lines, an anode of each of the Zener diodes being connected to one of the voltage signal lines on a negative electrode side of a corresponding one of the unit batteries that is connected in parallel to the Zener diode, and a cathode being connected to one of the voltage signal lines on a positive electrode side. A resistor portion group includes a plurality of resistor portions for restricting a current, the resistor portions being interposed between the Zener diodes and the unit batteries on the respective voltage signal lines; and a second protection circuit portion including a plurality of varistors that are connected to each other in series, the varistors being connected in parallel to the unit batteries between the plurality of voltage signal lines, and terminals of the varistors being connected to the voltage signal lines between the resistor portions and the unit batteries, wherein if an overvoltage occurs at both ends of the battery module when an open fault has occurred in some of the plurality of unit batteries, a current flows through the varistor and the Zener diode that are arranged in series with respect to the unit battery in which the open fault has occurred.

A battery monitoring device of a second disclosure includes: the above-described protection circuit; and a monitoring circuit connected to the plurality of voltage signal lines in the protection circuit, a voltage applied to the voltage signal lines being input to the monitoring circuit.

Advantageous Effects of Disclosure

According to the first disclosure, if an overvoltage occurs in the entirety of, or a portion of, the battery module, and the potential difference between any ones of the voltage signal lines increases, a current is flowed through the varistor that is arranged between these voltage signal lines, and an overcurrent can thus be prevented from flowing into the monitoring circuit side. Since a current can thus be flowed through the varistors, the amount of current that flows through the Zener diode can be kept small compared with the case where the varistors are not provided. If a current partially flows through the Zener diodes when an overcurrent occurs, the voltage between the voltage signal lines can be clamped by the Zener diodes. At this time, the voltage between the voltage signal lines can be clamped with the accuracy of the Zener diode, on the monitoring circuit side of the varistors. That is to say, even if the clamping accuracy of the varistors varies, the voltage can be clamped with the accuracy of the Zener diodes on the Zener diode side.

According to the second disclosure, a battery monitoring device can be realized that achieves a similar effect to that of the first disclosure.

DETAILED DESCRIPTION OF PREFERRED EMBODIMENTS

Embodiment 1

Embodiment 1 of the present disclosure will be described below.

Figure 1:
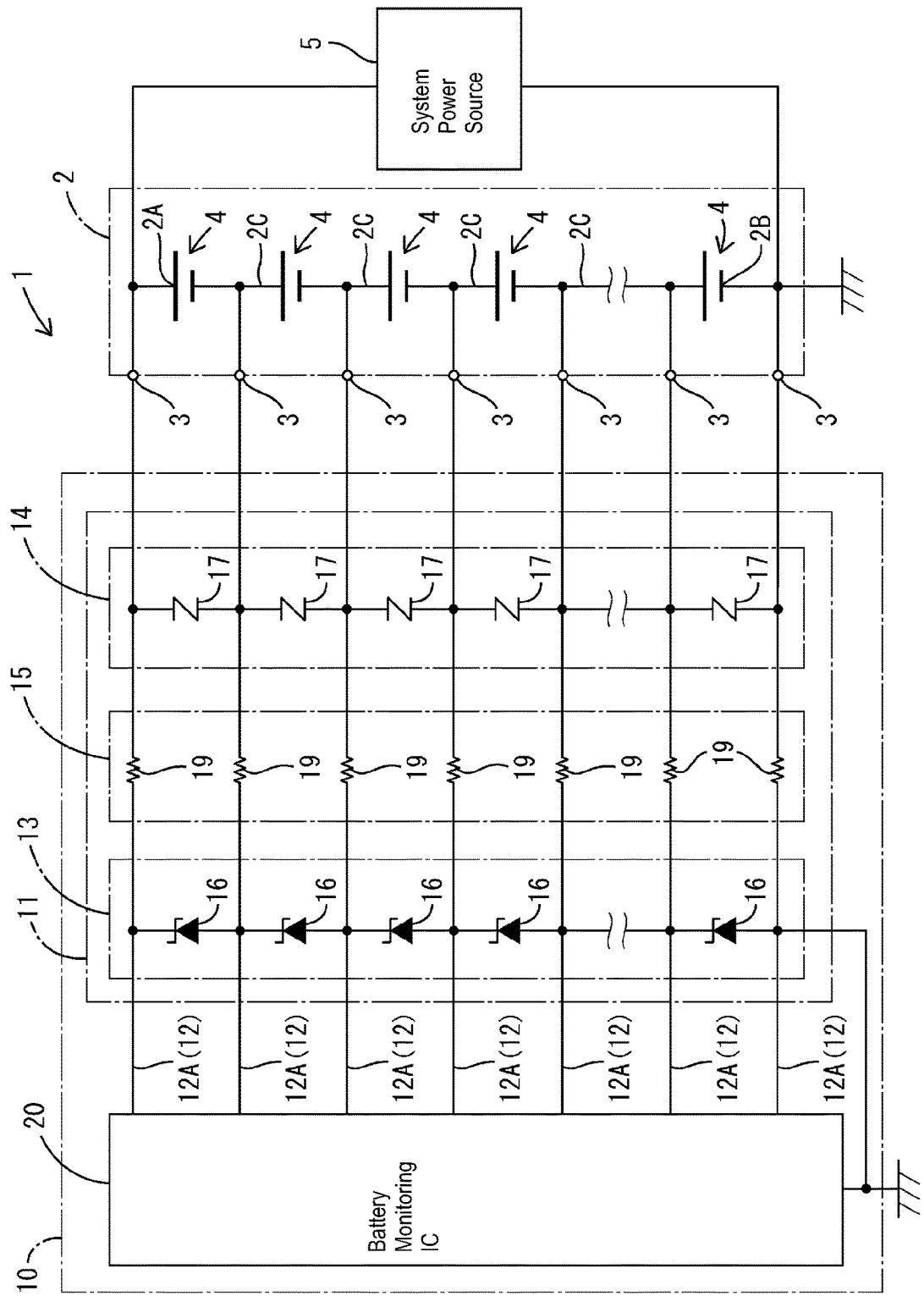
FIG. 1 is a circuit diagram illustrating an example of an in-vehicle battery system that includes a battery monitoring device according to Embodiment 1.

An in-vehicle battery system 1 shown in FIG. 1 includes an in-vehicle battery module 2 (hereinafter referred to also as a battery module 2), in which a plurality of unit batteries 4 are connected to each other in series, and a battery monitoring device 10 for an in-vehicle battery (hereinafter referred to also as a battery monitoring device 10) for detecting the voltage of each portion of the battery module 2. Note that FIGS. 1 to 5 omit some of the unit batteries 4, and also omit circuits corresponding to the omitted unit batteries 4.

The battery module 2 is a power storage means capable of functioning as an in-vehicle power source, and is mounted in a vehicle as a power source for a traveling motor of an electric vehicle (such as EV or HEV), for example. The battery module 2 is constituted by, for example, a serial connection body in which a plurality of unit batteries 4, which are lithium-ion secondary batteries or nickel-hydrogen secondary batteries, are connected to each other in series.

The battery module 2 can be attached to and detached from the later-described battery monitoring device 10. For example, terminals 3, which are connected to electrode portions 2A and 2B (hereinafter referred to also as electrode portions 2A and 2B) at end portions of the battery module 2 and to inter-battery electrode portions 2C (hereinafter referred to also as electrode portions 2C), can be attached to and detached from respective voltage signal lines 12A. A system power source 5 is connected to the electrode portions 2A and 2B of the battery module 2. The system power source 5 is an in-vehicle power source capable of charging the battery module 2, and may be any kind of power source capable of outputting power. In the example in FIG. 1, the output voltage from the system power source 5 is applied to the electrode portions 2A and 2B of the battery module 2, and, as a result of power being thus supplied, the unit batteries 4 in the battery module 2 are charged.

The battery monitoring device 10 is configured as an apparatus that monitors the battery module 2 and includes a protection circuit 11 and a battery monitoring IC 20, which is a monitoring circuit.

The protection circuit 11 has a signal line group 12, a first protection circuit portion 13, a second protection circuit portion 14, and a resistor portion group 15.

The signal line group 12 includes a plurality of voltage signal lines 12A. These voltage signal lines 12 are electrically connected to the electrode portions 2A and 2B, as well as to the electrode portions 2C of the plurality of unit batteries 4, which are connected to each other in series, in the battery module 2.

The electrode portion 2A is an electrode portion at one end portion of the battery module 2, and is an electrode portion with the largest potential in the battery module 2. The electrode portion 2B is an electrode portion at the other end portion of the battery module 2, and is an electrode portion with the smallest potential in the battery module 2. Each of the electrode portions 2C is a portion at which a positive electrode of one of two serially-connected unit batteries 4 is electrically connected to a negative electrode of the other one of these unit batteries 4. As for the potential at the electrode portions 2C, the potential at an electrode portion 2C that is closer to the electrode portion 2A is greater than the potential at an electrode portion 2C that is farther from the electrode portion 2A. Specifically, the potential at the plurality of electrode portions 2C is greater at a position closer to the electrode portion 2A within the circuit of the battery module 2.

The first protection circuit portion 13 includes a plurality of Zener diodes 16, which are connected to each other in series between the voltage signal line 12A with the highest potential and the voltage signal line 12A with the lowest potential. Every Zener diode 16 is provided between signal lines such that both ends of the Zener diode 16 are connected to two respective voltage signal lines 12A. Each of the Zener diodes 16 is connected to two voltage signal lines 12 whose portions connected to the battery module 2 are adjacent to each other within the circuit, of the plurality of voltage signal lines 12 that are connected to the electrode portions 2A, 2B, and 2C. Of two voltage signal lines 12A to which both ends of a Zener diode 16 are connected (i.e. voltage signal lines 12A whose portions connected to the battery module 2 are adjacent to each other), a signal line that is closer to the electrode portion 2B in the circuit has a lower potential, and a signal line that is closer to the electrode portion 2A has a higher potential.

The Zener diodes 16 are connected to the unit batteries 4 in parallel between signal lines of the plurality of voltage signal lines 12A that are connected to the electrode portions 2A, 2B, and 2C. An anode of each Zener diode 16 is connected to a voltage signal line 12A located on the negative electrode side of the unit battery 4 that is connected to this Zener diode 16 in parallel (i.e. a voltage signal line with a relatively low potential), and a cathode is connected to a voltage signal line 12A on the positive electrode side (i.e. a voltage signal line with a relatively high potential).

Both ends of each Zener diode 16 are connected to two respective voltage signal lines 12A, a cathode of each Zener diode 16 is connected to a voltage signal line 12A with a relatively high potential, and an anode is connected to a voltage signal line 12 with the next highest potential after the voltage signal line 12A with the higher potential. Due to the above connection, if the voltage across the terminals of each unit battery 4 that is connected in parallel to a corresponding Zener diode 16 increases to a predetermined value, a current flows from the cathode side toward the anode side of the Zener diode 16. Thus, the voltage between two voltage signal lines 12A that are connected to respective ends of the Zener diode 16 is kept at or below a predetermined voltage.

The second protection circuit portion 14 includes a plurality of varistors 17, which are connected to each other in series between the voltage signal line 12A with the highest potential and the voltage signal line 12A with the lowest potential. These varistors 17 are connected in parallel to the unit batteries 4 between the plurality of voltage signal lines 12A that are connected to the electrode portions 2A, 2B, and 2C, and terminals of each varistor 17 are connected between a later-described resistor portion 19 and to a unit battery 4 on the voltage signal lines 12A. Every varistor 17 is provided between signal lines such that both ends of the varistor 17 are connected to two respective voltage signal lines 12A. Each of the varistors 17 is connected to two voltage signal lines 12A whose portions are connected to the battery module 2 are adjacent within the circuit, of the plurality of voltage signal lines 12A that are connected to the electrode portions 2A, 2B, and 2C. The varistors 17 are connected in parallel to the respective unit batteries 4 and the respective Zener diodes 16. A portion of every voltage signal line 12 that is connected to a varistor 17 is located between a portion connected to a Zener diode 16 and a portion connected to a unit battery 4.

If the voltage across the terminals of a unit battery 4 that is connected in parallel to a varistor 17 increases to a predetermined value, a current flows from the voltage signal line 12A with a higher potential, of the two voltage signal lines 12A that are connected to respective ends of the varistor 17, toward the other voltage signal line 12A with a lower potential. Thus, the voltage between the two voltage signal lines 12A that are connected to respective ends of each varistor 17 is kept at or below a predetermined voltage.

The resistor portion group 15 includes a plurality of resistor portions 19. These resistor portions 19 are interposed between the Zener diodes 16 and the unit batteries 4 on the respective voltage signal lines 12, and restrict a current. Specifically, a resistor portion 10 is provided between a portion of each voltage signal line 12 that is connected to a Zener diode 16 and a portion of the voltage signal line 12 that is connected to a varistor 16, and the resistor portions 19 restrict a current such that voltage drops when a current flows through the respective voltage signal lines 12A from the second protection circuit portion 14 side toward the first protection circuit portion 13 side.

The battery monitoring IC 20 is connected to the plurality of voltage signal lines 12A in the protection circuit 11, and the voltage applied to the respective voltage signal lines 12A is input to the battery monitoring IC 20. The battery monitoring IC 20 has a function of detecting an input voltage that is input via the respective voltage signal lines 12A, and detect the voltage between the plurality of voltage signal lines 12 (i.e. voltage (cell voltage) across the electrodes of the respective unit batteries 4). The battery monitoring IC 20 has a plurality of input terminals, to which the plurality of voltage signal lines 12A are connected, and detects analog voltage signals that are input via the voltage signal lines 12A. Furthermore, the battery monitoring IC 20 detects a potential difference between the voltage signal lines 12 (i.e. voltage across the terminals of the respective unit batteries 4) based on the analog voltage signals that are input via the respective voltage signal lines 12A. Note that the battery monitoring IC 20 may also have an AD converter for converting an input analog voltage signal to a digital signal, and may also have a control circuit (CPU etc.) capable of determination and control that are based on each analog voltage signal.

Next, an operation of the battery monitoring device 10 will be described.

In this configuration, the plurality of unit batteries 4 that constitute the battery module 2 have an equal configuration, and the voltage at all of the unit batteries 4 in a fully-charged state takes about a predetermined value. Also, the plurality of varistors 17 have an equal configuration, and the varistor voltages of all of the varistors 17 are substantially the same. The plurality of Zener diodes 16 have an equal configuration, and the Zener voltages of all of the Zener diodes 16 are substantially the same. The voltage across the terminals of each unit battery 4 in a fully-charged state is smaller than the varistor voltage of the corresponding varistor 17, and is smaller than the Zener voltage of the corresponding Zener diode 16.

If all of the voltages between voltage signal lines 12A connected to the respective terminals of the unit batteries 4 are within a normal range (i.e. a range lower than the voltage value (predetermined value) at the unit batteries 4 in a full-charged state), and the voltage between both voltage signal lines 12A connected to both ends (the electrode portions 2A and 2B) of the entire battery module are within a normal range, the voltage between voltage signal lines 12 that are connected to both ends of every varistor 17 is smaller than the varistor voltage, and accordingly, no current flows through the varistors 17. Also, in this case, the voltage between voltage signal lines 12A that are connected to both ends of every Zener diode 16 is smaller than the Zener voltage, and accordingly, no current flows through the Zener diodes 16. In this case, analog voltage signals that correspond to the voltages at the respective electrode portions 2A, 2B, and 2C are input to the battery monitoring IC 20 via the voltage signal lines 12A. The battery monitoring IC 20 can thus detect the voltages at the electrode portions 2A, 2B, and 2C, or the voltage (cell voltage) across the terminals of each unit battery 4.

Next, a description will be given of an operation of the battery monitoring device 10 in a state (overvoltage-output state) where the output voltage from the system power source 5 is greater than a normal range, as an example of an operation when an abnormality has occurred.

Figure 4:
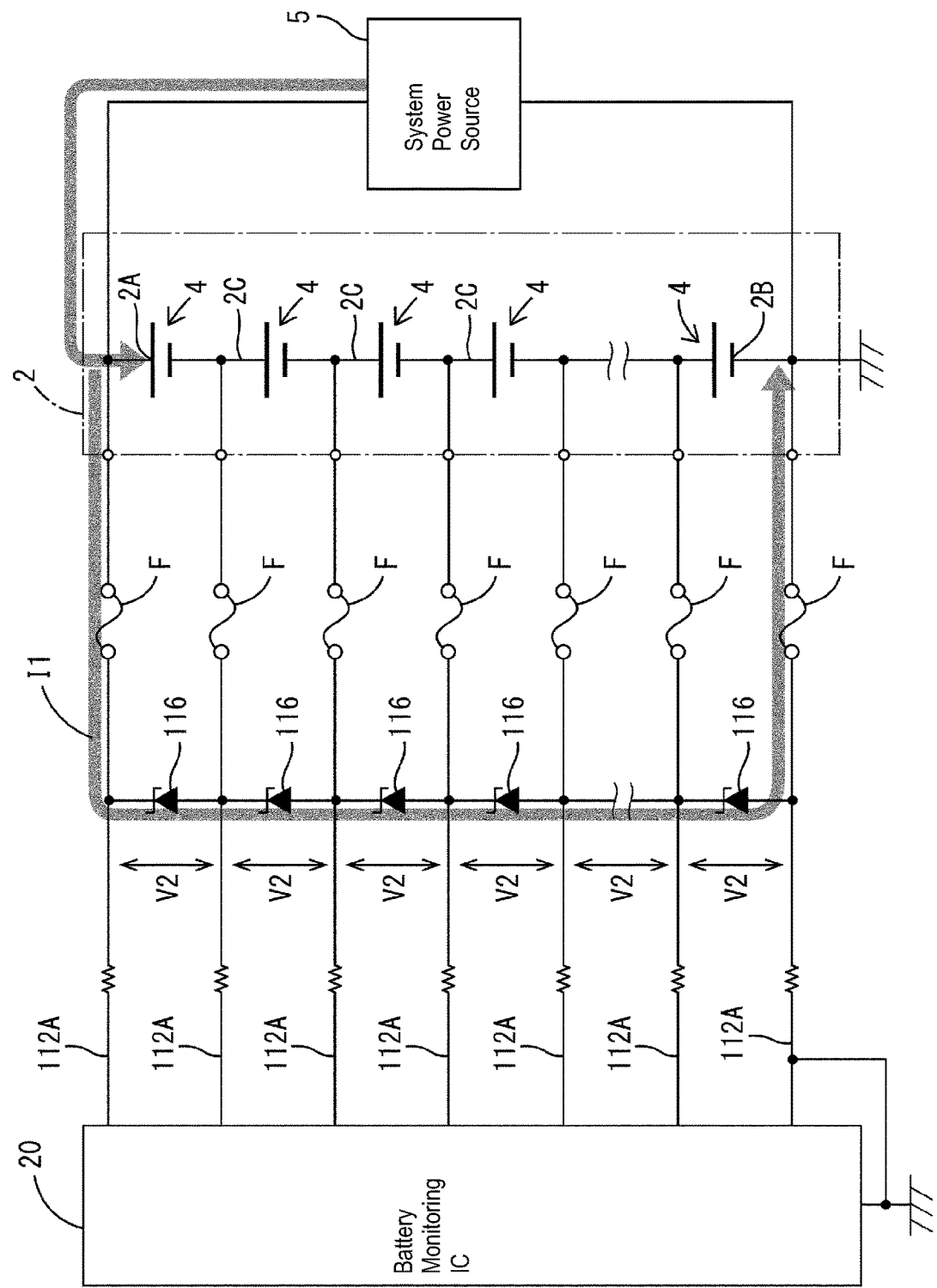
FIG. 4 is a diagram illustrating an example of the case where an overvoltage is applied from the system power source to the battery monitoring device in an in-vehicle battery system in a comparative example.

First, for comparison, a description will be given of an operation in a state (overvoltage-output state) where the output voltage from a system power source 5 is greater than a normal range in a battery system such as one shown in FIG. 4. In the battery system shown in FIG. 4, if an overvoltage is output from the system power source 5, and the potential difference between a voltage signal line 112A, which is connected to an electrode portion 2A, and a voltage signal line 112A, which is connected to an electrode portion 2B increases, a voltage V2 across the terminals of each of a plurality of Zener diodes 116, which are connected to each other in series between these voltage signal lines 112A on both sides increases. If the voltage V2 across the terminals becomes greater than the Zener voltage, a current flows from the electrode portion 2A side toward the electrode portion 2B side via the plurality of Zener diodes 116, and the voltage across the terminals of each Zener diode 116 is clamped to a voltage that is substantially the same as the Zener voltage. At this time, an overcurrent I1 flows through fuses F that are provided on the voltage signal lines 112A that are connected to the electrode portions 2A and 2B. If the overcurrent I1 exceeds the rated current of the fuses F and reaches a blowout current, the fuses F blow out. If, thereafter, the output voltage from the system power source 5 keeps the overvoltage-output state, the fuses F on voltage signal lines 112 that are adjacent to the voltage signal lines 112 that are connected to the blown fuses F then blow out, and ultimately all of the fuses F blow out. If the fuses F thus blow out, the overcurrent no longer flows into the circuit side on which the battery monitoring IC and the Zener diodes 116 are provided, but the battery monitoring IC 20 then cannot detect the voltage at each portion of the battery module 2. As a result, in the battery system in FIG. 4, if the fuses F blow out, the overvoltage-output state of the system power source 5 can be solved but the battery system cannot operate unless the fuses F are replaced.

Figure 2:
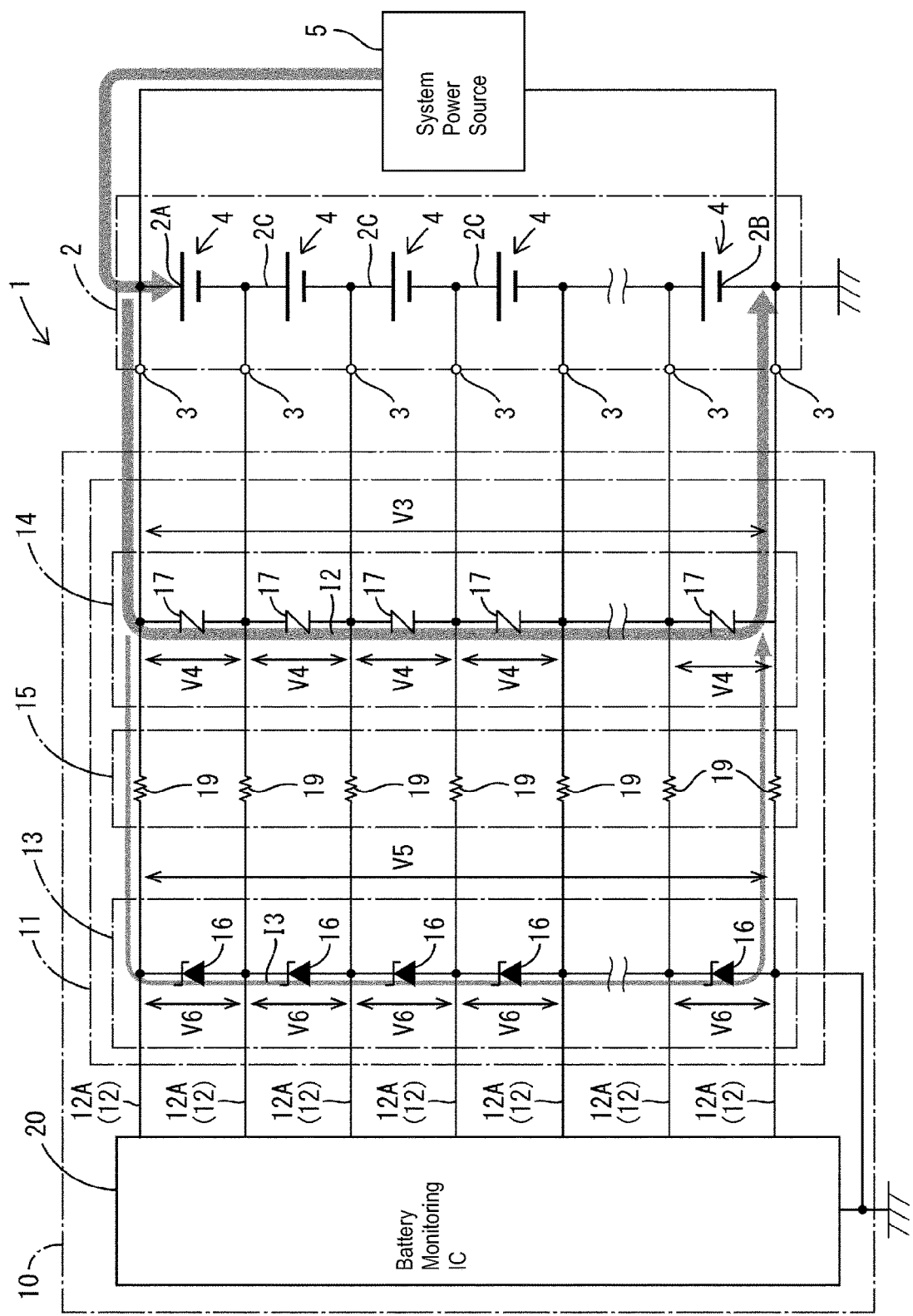
FIG. 2 is a diagram illustrating an example of the case where an overvoltage is applied from a system power source to the battery monitoring device in the in-vehicle battery system that includes the battery monitoring device according to Embodiment 1.

In contrast, in the battery monitoring device 10 with the present configuration shown in FIG. 2, if an overvoltage is output from the system power source 5 and the potential difference between the voltage signal line 12A connected to the electrode portion 2A and the voltage signal line 12A connected to the electrode portion 2B increases, a voltage V4 across the terminals of each of the plurality of varistors 17 that are connected in series to the voltage signal lines 12A on both sides increases. If the voltage V4 across the terminals of each varistor 17 then becomes greater than the varistor voltage of the varistor 17, a current I2 flows from the electrode portion 2A side toward the electrode portion 2B side via the varistors 17, and the voltage across the terminals of each varistor 17 is clamped substantially to a predetermined voltage.

Also, if an overvoltage is output from the system power source 5, and the potential difference between the voltage signal line 12A connected to the electrode portion 2A and the voltage signal line 12A connected to the electrode portion 2B increases, a voltage V6 across the terminals of each of the plurality of Zener diodes 16 that are connected in series to these voltage signal lines 12A on both sides also increases. If the voltage V6 across the terminals of each Zener diode 16 is greater than the Zener voltage thereof, a current I3 flows from the electrode portion 2A side toward the electrode portion 2B side via the Zener diodes 16, and the voltage across the terminals of each Zener diode 16 is clamped substantially to the Zener voltage.

Thus, in the battery monitoring device 10, if the potential difference between the voltage signal line 12A connected to the electrode portion 2A and the voltage signal line 12A connected to the electrode portion 2B increases due to an overvoltage being output from the system power source 5, a current flows through both the path in which the varistors 17 are connected to each other in series and the path in which the Zener diodes 16 are connected to each other in series, and an overcurrent flowing into the battery monitoring IC 20 side can be suppressed. In the state where a current is thus flowing through both series paths, a current flowing in a direction from the varistors 17 side toward the Zener diodes 16 side is restricted by the presence of the resistor portions 19 that are arranged on the voltage signal lines 12A. For this reason, a voltage V5 across the terminals of the path in which the Zener diodes 16 are connected to each other in series is smaller than the voltage V3 across the terminals of the path in which the varistors 17 are connected to each other in series, and the voltage applied to the Zener diodes 16 when an overvoltage occurs is suppressed. Also, since the battery monitoring device 10 has a path in which the varistors 17 are connected to each other in series, the current flowing through the path in which the Zener diodes 16 are connected to each other in series can be suppressed at least for the path of the varistors 17. Furthermore, with this configuration, when an overvoltage occurs as shown in FIG. 2, a greater current can be flowed through the path in which the varistors 17 are connected to each other in series, and the current I3 flowing through the path in which the Zener diodes 16 are connected to each other can be made smaller than the current I2 flowing through the path of the varistors 17.

With this configuration, the variation in the clamping voltage between the individual Zener diodes 16 is smaller than the variation in the clamping voltage between the individual varistors 17, due to the characteristics of the Zener diodes and the varistors. That is to say, even if the clamping voltage of the varistors 17 significantly varies when an overvoltage occurs, the clamping voltage of the Zener diodes 16 can be kept substantially at a fixed value while being suppressed from varying. Accordingly, the potential difference between adjacent input terminals in the battery monitoring IC 20 can be prevented from increasing due to the variation.

In this configuration, if an overvoltage such as that shown in FIG. 2 occurs, the above-described protective operation is performed. If the overvoltage state of the system power source 5 has been solved and restored to the normal state as a result of some kind of processing or operation, both the voltage V6 across the terminals of each Zener diode 16 and the voltage V4 across the terminals of each varistor 17 decreases, and thus, a current no longer flows through the path of the varistors 17 and the path of the Zener diodes 16. If the system power source 5 has been thus restored to the normal state, the voltage at the electrode portions 2A, 2B, and 2B, or the voltage (cell voltage) across the terminals of each unit battery 4 can be detected by the battery monitoring IC 20.

Next, a description will be given of an operation of the battery monitoring device 10 when an open fault has occurred in any of the electrode portions 2A, 2B, and 2C in the case where a state (overvoltage-output state) has been entered where the output voltage from the system power source 5 becomes greater than a normal range, as another example of operations when an abnormality has occurred.

Figure 5:
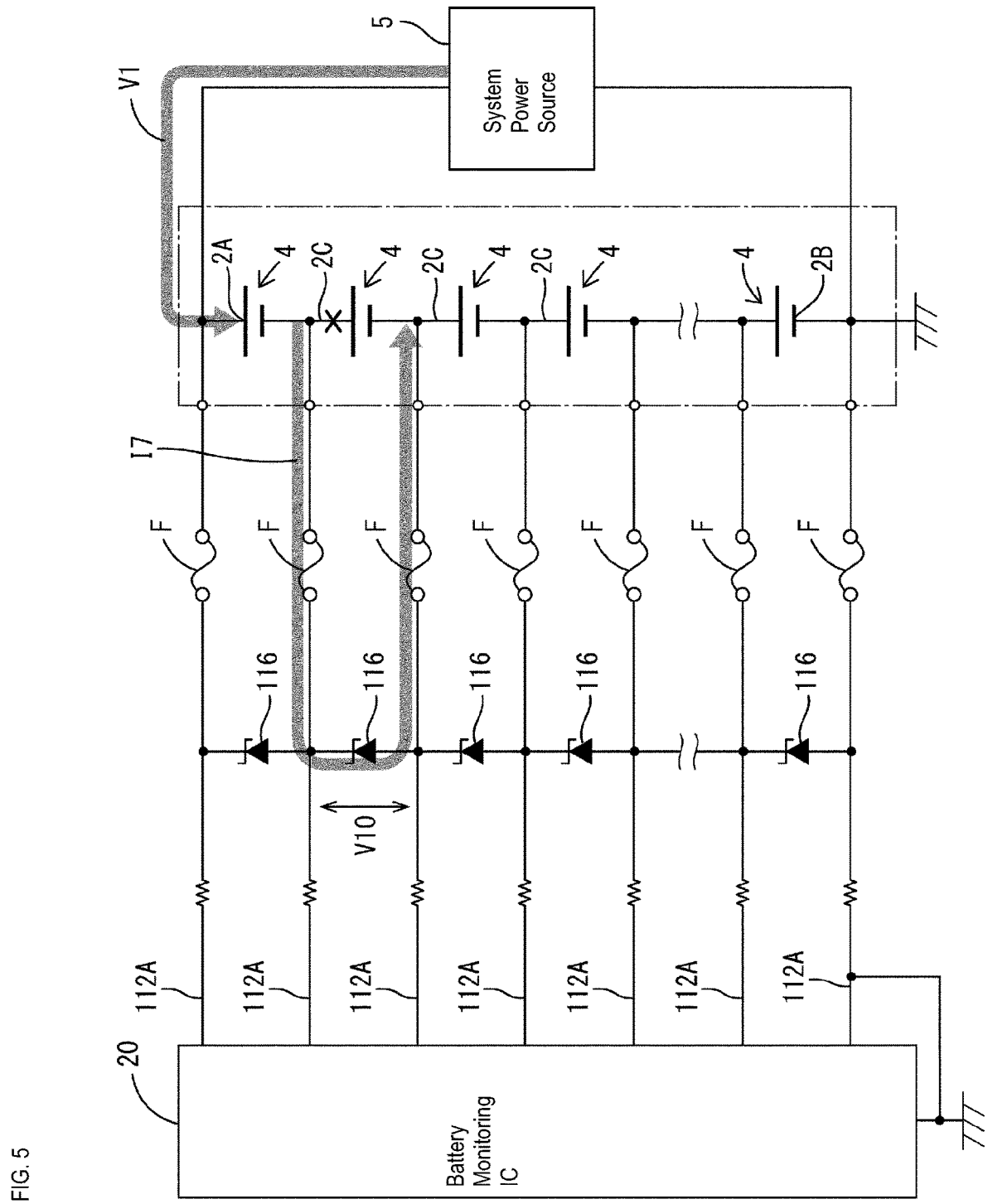
FIG. 5 is a diagram illustrating another example of the case where an overvoltage is applied from the system power source to the battery monitoring device in an in-vehicle battery system in a comparative example.

First, the case where the aforementioned abnormality has occurred will be described using a comparative example shown in FIG. 5. In a battery system shown in FIG. 5, if an open fault, such as a brake, has occurred in some of the unit batteries 4 that are to be connected in series, when an overvoltage is output from the system power source 5, an overcurrent flows to pass through fuses F and Zener diodes 116 while avoiding the position at which the open fault has occurred, as shown in FIG. 5. Specifically, as shown in FIG. 5, if a voltage V10 across the terminals of a Zener diode 116 that is arranged in parallel to the unit battery 4 at which the open fault has occurred increases and becomes greater than the Zener voltage due to the generation of the overvoltage, and a current I7 flows through this Zener diode 116, and the voltage across the terminals of the Zener diode 116 is clamped substantially to the Zener voltage. If the overcurrent I7 then exceeds the rated current of the fuses F and reaches a blowout current, the fuses F blow out. In this case as well, the voltage cannot be detected via the brown path unless the fuses F are replaced.

Figure 3:
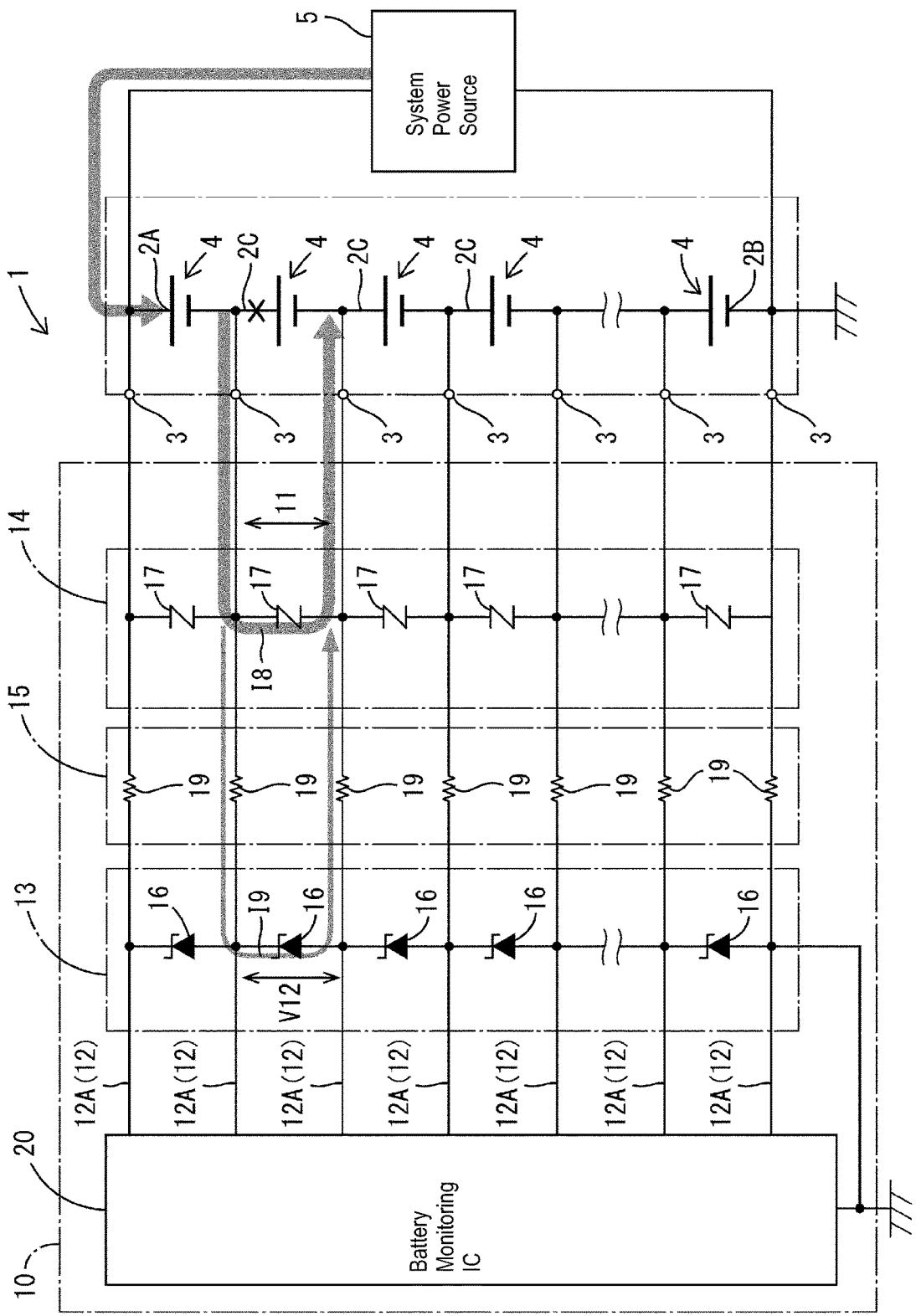
FIG. 3 is a diagram illustrating another example of the case where an overvoltage is applied from the system power source to the battery monitoring device in the in-vehicle battery system that includes the battery monitoring device according to Embodiment 1.

In contrast, in the battery monitoring device 10 according to Embodiment 1, if an open fault, such as a brake, has occurred at some of the unit batteries 4 that are to be connected to each other in series (in the example in FIG. 3, an inter-terminal electrode portion 2C of the second unit battery 4) when an overvoltage is output from the system power source 5, as shown in FIG. 3, an overcurrent flows to pass through the varistors 17 and the Zener diodes 16 while avoiding the position at which the open fault has occurred, as shown in FIG. 3. Specifically, a voltage V11 across the terminals of the varistor 17 and a voltage V12 across the terminals of the Zener diode 16, the varistor 17 and the Zener diode 16 being arranged in parallel to the unit battery 4 at which the open fault has occurred, increase due to the generation of the overvoltage, as shown in FIG. 3. If the voltage V11 across the terminals of the varistor 17 arranged in parallel to the unit battery 4 at which the open fault has occurred becomes greater than the varistor voltage, a current I8 flows through this varistor 17, and the voltage across the terminals of the varistor 17 is clamped to a predetermined voltage. Also, if the voltage V12 across the terminals of the Zener diode 16 that is arranged in parallel to the unit battery 4 at which the open fault has occurred becomes greater than the Zener diode, a current I9 flows through this Zener diode 16, and the voltage across the terminals of the Zener diode 16 is clamped substantially to the Zener voltage.

Thus, even if an overvoltage occurs in a state such as that shown in FIG. 3, the circuit can be protected by flowing an overcurrent via the varistor 17 and the Zener diode 16 that are provided in parallel to the unit battery 4 at which the open fault has occurred. In this case as well, the current in the direction from the varistors 17 side toward the Zener diodes 16 side is restricted by the presence of the resistor portion 19, and the voltage applied to the Zener diode 16 is suppressed. Also, the current flowing through the Zener diodes 16 can be suppressed at least for the current I8 flowing through the varistors 17. Furthermore, a greater current can also be flowed through the varistors 17, and the current I9 flowing through the Zener diode 16 can be further reduced. Also, even if the clamping voltage of the varistors 17 is significantly inaccurate, the clamping voltage of the Zener diodes 16 can be accurately kept at a desired value.

Next, examples of the effects of the above configuration will be described.

If an overvoltage occurs in the entirety of, or a portion of, the battery module 2, and the potential difference between any of the voltage signal lines increases, the protection circuit 11 flows a current through varistors 17 that are arranged between these voltage signal lines, and can thus prevent an overcurrent from flowing toward the battery monitoring IC (monitoring circuit) side. Since a current can thus be flowed through the varistors 17, the amount of current that flows through the Zener diodes 16 can be made smaller than in the case where the varistors 17 are not provided. If a current partially flows through the Zener diodes 16 when an overcurrent occurs, the voltage between the voltage signal lines can be clamped by the Zener diodes 16. At this time, the voltage between the voltage signal lines can be clamped with the accuracy of the Zener diodes 16 on the battery monitoring IC (monitoring circuit) side of the varistors 17. That is to say, even if the clamping accuracy at the varistors 17 varies, a voltage can be clamped with the accuracy of the Zener diodes 16 on the Zener diode 16 side.

Other Embodiments

The present disclosure is not limited to the embodiment that has been described in the above description and drawings, and for example, the following embodiments are also encompassed in the technical scope of the present disclosure.

Although the above embodiment has described an example of the battery module 2, the number of unit batteries to constitute the battery module need only be more than one, and is not limited. The number of voltage signal lines to be connected to respective portions of the battery module need only be more than one, and is not limited either.

Although the above embodiment has described, as an example, a configuration in which the voltage signal lines 12A are connected to the electrode portions 2A, 2B, and 2C of the battery module 2, the voltage signal lines do not need to be connected to one or more positions of the electrode portions at both ends and all of the electrode portions between the batteries in the battery module. For example, one voltage signal line may be connected to a plurality of unit batteries, of the unit batteries 4 that are connected to each other in series.

Although the above embodiment has described, as an example of the unit battery 4, a secondary battery such as a nickel-hydrogen battery or a lithium-ion battery, a power storage means, such as an electric double layer capacitor, may be used in place of such a secondary battery.

Although the above embodiment has described, as an example, a configuration in which the battery module 2 is provided outside of the battery monitoring device 10, the battery monitoring device may be configured to include the battery module. That is to say, the battery monitoring device may include, but does not need to include, the battery module as a constituent element. In the case where the battery monitoring device includes the battery module as a constituent element, for example, a circuit structure configured by providing Zener diodes, voltage signal lines, and so on, on a substrate may be integrated with the battery module.

Although the above embodiment has described an example in which one battery monitoring device 10 monitors each portion of one battery module 2, if a plurality of battery modules are provided in a vehicle, the battery monitoring device may be provided so as to monitor the plurality of battery modules, or battery monitoring devices may be provided in one-to-one correspondence with the battery modules. For example, a configuration may be employed in which a plurality of battery modules 2 are connected to each other in series, and the output voltage is applied from the system power source to the plurality of battery modules 2 that are connected to each other in series. In this case, one battery monitoring device may be connected to each one of the battery modules 2, or one battery monitoring device may be allocated and connected to the plurality of battery modules. Also, a plurality of battery monitoring devices may be allocated to each of the battery modules 2.

The invention claimed is:

1. A protection circuit for a battery monitoring device that monitors a battery module having a configuration in which a plurality of unit batteries are connected to each other in series, the protection circuit comprising:
   a signal line group including a plurality of voltage signal lines, which are electrically connected to inter-battery electrode portions between the plurality of unit batteries that are connected to each other in series, or electrode portions at end portions of the battery module;
   a first protection circuit portion including a plurality of Zener diodes that are connected to each other in series, the Zener diodes being connected in parallel to the unit batteries between the plurality of voltage signal lines, an anode of each of the Zener diodes being connected to one of the voltage signal lines on a negative electrode side of a corresponding one of the unit batteries that is connected in parallel to the Zener diode, and a cathode being connected to one of the voltage signal lines on a positive electrode side;
   a resistor portion group including a plurality of resistor portions for restricting a current, the resistor portions being interposed between the Zener diodes and the unit batteries on the respective voltage signal lines; and
   a second protection circuit portion including a plurality of varistors that are connected to each other in series, the varistors being connected in parallel to the unit batteries between the plurality of voltage signal lines, and terminals of the varistors being connected to the voltage signal lines between the resistor portions and the unit batteries,
   wherein if an overvoltage occurs at both ends of the battery module when an open fault has occurred in some of the plurality of unit batteries, a current flows through the varistor and the Zener diode that are arranged in series with respect to the unit battery in which the open fault has occurred.

2. A battery monitoring device comprising:
   the protection circuit according to claim 1; and a monitoring circuit connected to the plurality of voltage signal lines in the protection circuit, a voltage applied to the voltage signal lines being input to the monitoring circuit.

* * * * *